(12) United States Patent
Jackson et al.

(10) Patent No.: US 10,714,830 B2
(45) Date of Patent: Jul. 14, 2020

(54) DIGITAL PHASE SHIFTER SWITCH AND TRANSMISSION LINE REDUCTION

(71) Applicant: Hughes Network Systems, LLC, Germantown, MD (US)

(72) Inventors: Thomas Jackson, Englewood, CA (US); Bingqian Lu, Englewood, CA (US); Hamad Alsawaha, Englewood, CA (US); Peter Hou, Englewood, CA (US); Yilin Mao, Englewood, CA (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 331 days.

(21) Appl. No.: 15/723,692

(22) Filed: Oct. 3, 2017

(65) Prior Publication Data
US 2019/0103672 A1    Apr. 4, 2019

(51) Int. Cl.
| | | |
|---|---|---|
| H01Q 3/38 | (2006.01) | |
| H01P 1/185 | (2006.01) | |
| H03H 7/18 | (2006.01) | |
| H03H 7/20 | (2006.01) | |

(52) U.S. Cl.
CPC ............. *H01Q 3/38* (2013.01); *H01P 1/185* (2013.01); *H03H 7/185* (2013.01); *H03H 7/20* (2013.01)

(58) Field of Classification Search
CPC .......... H01Q 3/38; H01Q 3/26; H01Q 3/2605; H01Q 3/36; H01Q 3/22; H01Q 25/00; H01P 1/185; H03H 7/185; H03H 7/20
USPC ....................................................... 342/372
See application file for complete search history.

(56) References Cited

U.S. PATENT DOCUMENTS

| | | | | |
|---|---|---|---|---|
| 3,436,691 A | * | 4/1969 | Hoffman | H03H 7/20 333/164 |
| 3,568,105 A | | 3/1971 | Felsenheld | |
| 3,655,997 A | * | 4/1972 | O'Daniel | H01Q 3/385 327/237 |
| 2006/0109067 A1 | * | 5/2006 | Shtrom | H01P 1/185 333/164 |
| 2008/0150800 A1 | * | 6/2008 | Tsuji | H01P 1/185 342/368 |
| 2010/0277289 A1 | * | 11/2010 | Brauner | G06K 7/0008 340/10.51 |

(Continued)

OTHER PUBLICATIONS

International Search Report and Written Opinion in PCT/US2018/054041, dated Jan. 4, 2019, 14 pages.

*Primary Examiner* — Harry K Liu
(74) *Attorney, Agent, or Firm* — Sheppard, Mullin, Richter & Hampton LLP

(57) ABSTRACT

A digital phase shifter is described where each bit of the phase shifter has a circuit block including one PIN diode in parallel with one transmission line. The phase shifter requires only one PIN diode and one transmission line per bit circuit block. Each PIN diode behaves like a simple switch for phase shifting. When the PIN diode is forward biased ("on" state), current flows through the PIN diode and the RF signal is not phase shifted. When the pin diode is not forward biased ("off" state), current flows through the transmission line parallel to the PIN diode and the RF signal is phase shifted by the transmission line. The digital phase shifter may have n circuit blocks in series, and adjacent PIN diodes may share a current when both are on. The phase shifter may be implemented in a phased array or reflect array antenna including multiple phase shifters.

20 Claims, 11 Drawing Sheets

(56) References Cited

U.S. PATENT DOCUMENTS

2015/0130293 A1* 5/2015 Hajimiri .............. H01Q 21/225
　　　　　　　　　　　　　　　　　　　　　307/104

* cited by examiner

DIGITAL PHASE SHIFTER SWITCH AND TRANSMISSION LINE REDUCTION

TECHNICAL FIELD

The present disclosure relates generally to phase shifters.

BACKGROUND

Phase shifters are used in systems to change a transmission phase angle of an input signal. Their most recognized application is in phased array antennas that include multiple transmitting and/or receiving antenna elements that can be used together to form a directional radiation pattern. The relative phases or the respective signals feeding the antennas are controlled using phase shifters to create an effective radiation pattern that is strongest in a desired direction and suppressed in undesired directions. In this manner the antenna beam may be rapidly steered without any mechanical steering of the antenna (e.g., using a gimbal).

Quantized or "digital" phase shifters may be used to control the phases of the signals feeding the antenna elements by providing a discrete number of phase states controlled using phase bits having two states, where for n-bit phase shifter there are $2^n$ states available. As such, the higher the number of phase bits, the more accurate the phase shifter. For example, in the case of an ideal 2-bit phase shifter, the phases of the signals may switch between four states, 0°, 90°, 180°, and 270°, which have a step size of 90° and a maximum quantization error of ±45°. In the case of an ideal 3-bit phase shifter, the phases of the signals may switch between eight states, 0°, 45°, 90° 135°, 180°, 225°, 270°, and 315°, which have a step size of 45° and a maximum quantization error of ±22.5°.

In commercial practice, switched line phase shifters are typically used in digital phase shifters as fundamental components for phased array antennas. These phase shifters typically use PIN diodes (diodes having an undoped intrinsic semiconductor region between p-type and n-type semiconductor regions) for switching between different transmission lines. FIG. 1 illustrates a basic schematic of a conventional design of a 1-bit (two state) switched line phase shifter 10. In this design, two, Single Pole Double Throw (SDPT) switches, including four PIN diodes 11a-d, are used to route a signal flow between one of two transmission lines, L1 or L2, having a different electrical length (e.g., in wavelengths). For each transmission line, the phase may depend on the electrical length of the line and the propagation constant of the line. As such, a phase shift between the two lines is realized by differing the electrical lengths of the lines. In this implementation, a RF signal (e.g., a signal having a frequency between about 3 kHz to 300 GHz) may be routed through line L1 (and thus have a phase delay $\phi_1$ based on the length of L1) by forward biasing (turning "on") PIN diodes 11a and 11b and applying no bias to or reverse biasing (turning "off") PIN diodes 11c and 11d. Alternatively, a signal may be routed through line L2 (and thus have a phase delay $\phi_2$ depending on the length of L2) by turning on PIN diodes 11c and 11d and turning off PIN diodes 11a and 11b. In this implementation, each of the turned on PIN diodes is individually forward biased using a PIN diode bias circuit (not shown) that provides a controlled forward bias current (e.g., about 5-10 mA) for each pin diode.

FIG. 2 illustrates a basic schematic of a conventional design of a 3-bit switched line phase shifter 20. As illustrated, the circuit block of FIG. 1 is repeated three times, in series, to provide 3-bits (i.e., eight possible phase states). Phase shifter 20 requires twelve PIN diodes and six transmission lines.

SUMMARY

Embodiments described herein are directed to a phase shifter design where each bit of the phase shifter has circuitry including one PIN diode in parallel with one transmission line. The phase shifter design described herein may be used in a variety of applications, including aperture array antennas having multiple fixed antenna elements.

In one embodiment, a phase shifter includes: first circuitry, including: a PIN diode; a transmission line parallel to the PIN diode, and a biasing circuit configured to forward bias or reverse bias the PIN diode. In this embodiment, the transmission line is configured to phase shift an RF signal that passes through the transmission line. An RF signal received at the phase shifter passes through the PIN diode when the PIN diode is under forward bias, and an RF signal received at the phase shifter passes through the transmission line when the PIN diode is not under forward bias.

In implementations, the phase shifter may include second circuitry in series with the first circuitry, where the second circuitry includes: a second PIN diode; a second transmission line parallel to the second PIN diode, where the second transmission line is configured to phase shift an RF signal that passes through the second transmission line; and a second biasing circuit configured to forward bias or reverse bias the second PIN diode. In this implementation, an RF signal received at the phase shifter passes through the second PIN diode when the second PIN diode is forward biased, and an RF signal received at the phase shifter passes through the second transmission line when the second PIN diode is not forward biased.

In implementations, the biasing circuit of the first circuitry is configured to forward bias the second PIN diode when both the first PIN diode and the second PIN diode are forward biased, and the second biasing circuit is configured to forward bias the second PIN diode when the first PIN diode is not forward biased.

In implementations, the phase shifter is an n-bit phase shifter where n≥2, and where the number of transmission lines in the phase shifter is equal to n. In these implementations, the number PIN diodes in the phase shifter may be equal to n. For example, the phase shifter may be a 4-bit phase shifter having four transmission lines and four pin diodes. In some implementations, the phase shifter may be comprised of 5 bits, 6 bits, 7 bits, 8 bits, or even greater than 8 bits.

In implementations, the biasing circuit includes a direct current voltage source configured to apply a constant voltage for generating a forward or reverse bias on the PIN diode. The biasing circuit may also include an inductor configured to block RF signals from enter the biasing circuit and a bypass capacitor configured to reduce AC noise present on a DC signal generated at the biasing circuit.

In implementations, the phase shifter may include an input RF port and an output RF port; a first direct current blocking capacitor configured to block DC bias from flowing into the input RF port; and a second direct current blocking capacitor configured to block DC bias from flowing into the output RF port.

In one embodiment, an aperture array antenna includes: a plurality of quantized phase shifters, each of the plurality of quantized phase shifters including a PIN diode in parallel with a transmission line configured to phase shift an RF signal; and a plurality of antenna elements, where each of the plurality of antenna elements is configured to receive a phase shifted signal from a respective one of the plurality of quantized phase shifters. The aperture array antenna may be a phased array antenna or a reflect array antenna.

Each of the plurality of quantized phase shifters of the antenna may include a biasing circuit configured to forward bias or reverse bias the PIN diode. For each of the plurality of quantized phase shifters: an RF signal received at the quantized phase shifter may pass through the PIN diode of the quantized phased shifter when the PIN diode of the quantized phase shifter is under forward bias, and an RF signal received at the quantized phase shifter may pass through the transmission line of the quantized phase shifter when the PIN diode of the quantized phase shifter is not under forward bias.

In implementations, each of the plurality of quantized phase shifters of the antenna is an n-bit phase shifter where n≥2, where each of the plurality of quantized phase shifters includes n circuit blocks, where the n circuit blocks are in series, and where each of the n circuit blocks includes a PIN diode in parallel with a transmission line configured to phase shift an RF signal. In implementations, each of the plurality of quantized phase shifters of the antenna includes n transmission lines and n PIN diodes.

In implementations, each of the biasing circuits includes: a direct current voltage source configured to apply a constant voltage for generating a forward bias or reverse bias on a PIN diode; an inductor configured to block RF signals from enter the biasing circuit; and a bypass capacitor to short AC noise to ground.

In one embodiment, a method includes: receiving a radio frequency (RF) signal at an input RF port of a quantized phase shifter, where the quantized phase shifter includes first circuitry, the first circuitry including: a PIN diode in parallel to a transmission line configured to phase shift an input RF signal; forward biasing the PIN diode; and passing the received RF signal through the forward biased PIN diode and not the transmission line.

In implementations, the method may further include: receiving a second RF signal at the input RF port of the quantized phase shifter; reverse biasing the PIN diode of the quantized phase shifter; and after reverse biasing the PIN diode of the quantized phase shifter, passing the second RF signal through the transmission line and not the PIN diode.

In implementations of this method, the quantized phase shifter includes second circuitry in series with the first circuitry, the second circuitry including a second PIN diode in parallel to a second transmission line configured to phase shift an input RF signal, and the method further includes: forward biasing the second PIN diode; and passing the RF signal through the second forward biased PIN diode and not the second transmission line.

In implementations of this method, the PIN diode of the first circuitry and the PIN diode of the second circuitry are forward biased using the same current.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

As discussed above, the conventional design of a switched line phase shifter requires four PIN diodes and two transmission lines for each phase bit. Additionally, during operation of each bit, 2 PIN diodes are individually biased to route a signal through a transmission line. This design may present several issues.

Figure 1:
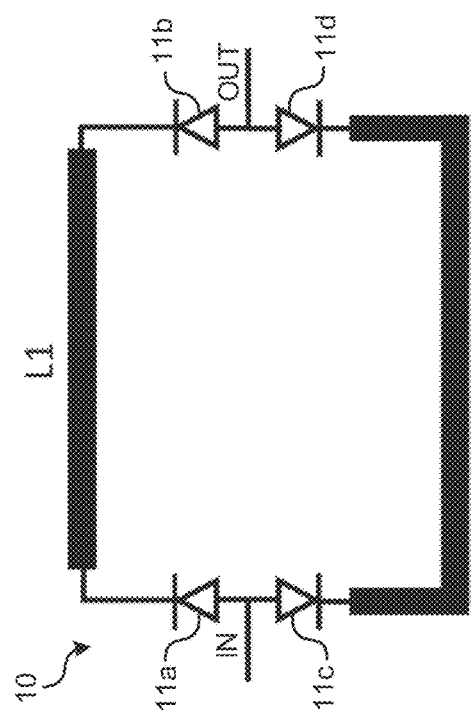
FIG. 1 illustrates a basic schematic of a conventional design of a 1-bit switched line phase shifter.

First, as PIN diodes are current controlled devices, the conventional design illustrated in FIG. 1 requires a DC bias current to be supplied for two diodes at a time for each phase bit. For a typical phased array antenna design, using 4, 6, or 8-bit phase shifters, for example, a DC current would need to be supplied for 8, 12, or 16 diodes at a time. For instance, in a system having 6-bit phase shifters, where each PIN diode has about 5 mA of forward bias applied during operation, a total of 120 mA of current would need to be supplied to the 24 PIN diodes of the phase shifter. In a system having hundreds of phase shifters, this configuration consumes a large amount of power, which can introduce unwanted noise and heat into the system.

Second, the requirement of having 4n PIN diodes and 2n transmission lines per n-bit phase shifter may greatly increase the cost and complexity of the phase shifter circuitry of the system, particularly in systems such as phased array antennas that utilize hundreds, or even thousands, of switched line phase shifters.

Embodiments described herein are directed to a phase shifter design that addresses these problems. As illustrated by FIGS. 6-11, and further described below, embodiments disclosed herein are directed to a phase shifter design where each bit of the phase shifter has circuitry including one PIN diode in parallel with one transmission line. The illustrated design only requires one PIN diode and one transmission line per bit. In this design, the PIN diode behaves like a simple switch for its respective bit. When the PIN diode is forward biased ("on" state), current flows through the PIN diode. When the pin diode is not forward biased ("off" state), current flows through the transmission line parallel to the PIN diode.

This design may present several benefits over the conventional switched line phase shifter design described above. First, this design requires only one PIN diode and one transmission line per bit (i.e., n PIN diodes and n transmission lines per n-bit phase shifter), which may greatly decrease the size, cost, and complexity of the phase shifter circuitry, especially in systems requiring hundreds of multi-bit phase shifters. In particular, the reduction in transmission lines may dramatically reduce the size (and thus the cost) of the circuitry of the phase shifters. Additionally, the reduction in PIN diodes by a factor of four greatly reduces the required PIN diode bias circuitry. Second, as only up to one PIN diode needs to be forward biased for each bit of the phase shifter during its operation, power consumption may be greatly decreased. Third, in cases where pin diodes of adjacent circuit elements are in the on state at the same time, these pin diodes may share the same current, further reducing the power consumption of the system.

Figure 3:
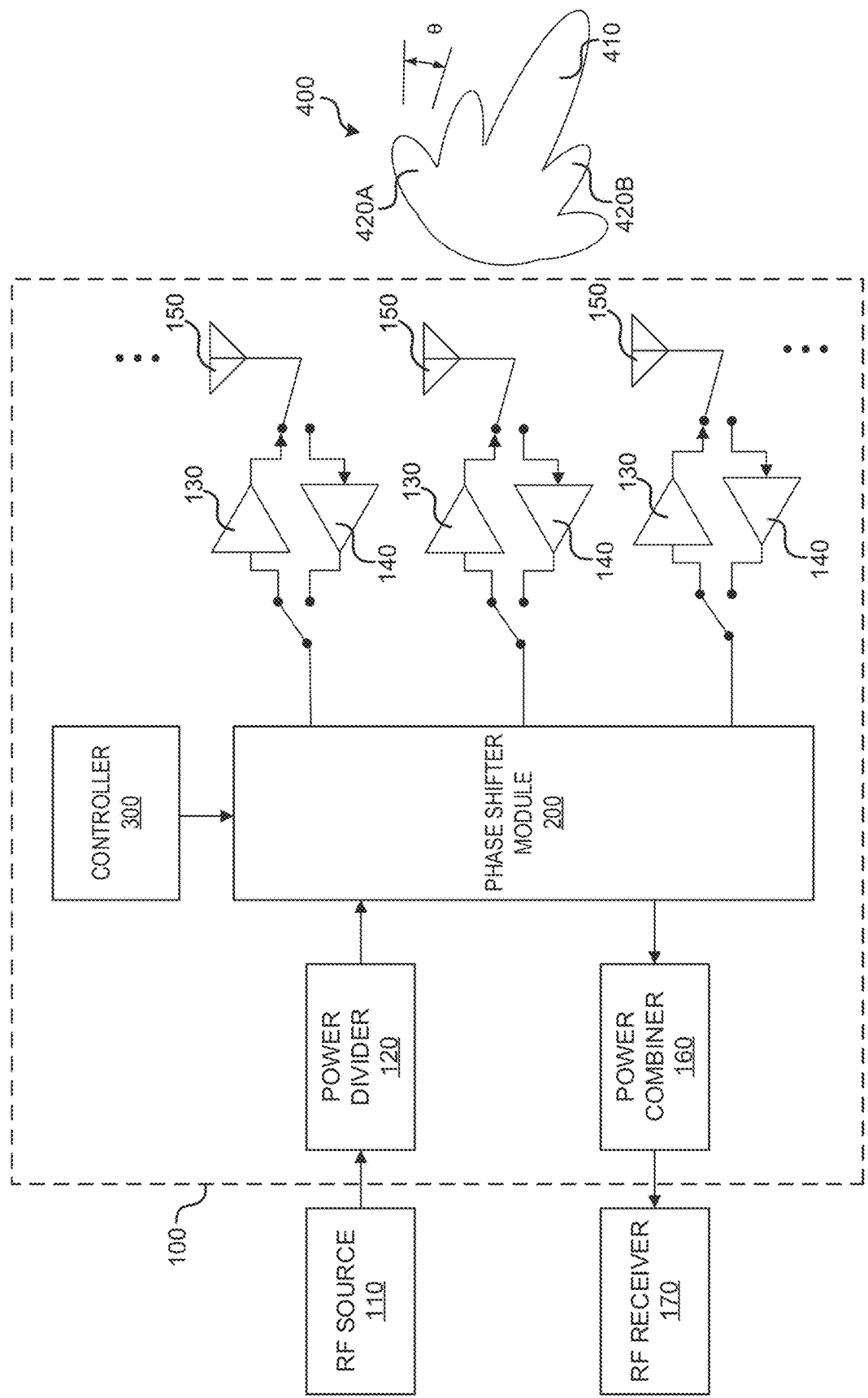
FIG. 3 is a block diagram illustrating an example bi-directional phased array antenna in which embodiments of the phase shifter described herein may be implemented.

Before describing the phase shifter disclosed herein in greater detail, it is instructive to describe an example system in which the phase shifter may be implemented. FIG. 3 is a block diagram illustrating an example bi-directional phased array antenna 100, including antenna elements 150, in which embodiments may be implemented. Although a bi-directional phased array antenna 100 is shown in this example, the phased shifter described herein may be implemented in unidirectional transmit phased array antennas, reflect array antennas, radars such as those used in automotive collision sensors, weather monitoring systems that steer beams, medical imaging applications, implantable medical monitoring sensors and systems, and other systems that utilize digitized phase shifters.

Phased array antenna 100 may be implemented as a dynamic phased array antenna (i.e., each antenna element or group of elements may have an adjustable phase shifter), an active phased array antenna (i.e., each antenna element or group elements may have transmit amplification circuitry), a passive phased array antenna, or some variant thereof. Phased array antenna 100 may be implemented in a variety of devices. For example, in one implementation phased array antenna 100 may be implemented in a fixed terminal (e.g., a VSAT terminal) communicating with a satellite. In such implementations, the technology disclosed herein may offer an affordable way of steering the antenna beam, automatically pointing the beam to the satellite, and periodically repointing the antenna beam to compensate for minor antenna movements due to ground settlement, ground freezing/thawing cycles, etc. In other implementations, phased array antenna 100 may be implemented in moving satellites (e.g., a low earth orbit satellite, a medium earth orbit satellite, etc.) and/or moving terminals that are on moving platforms (e.g., on a terrestrial vehicle or aircraft). In such implementations, the technology disclosed herein may provide an affordable way of fast beam tracking that constantly points the antenna beam towards the satellite. As yet another example, phased array antenna 100 may be implemented as a component of a radar system.

As illustrated by FIG. 3, example phased array antenna 100 includes a power divider 120, transmit amplifiers 130, antenna elements 150, one or more low noise amplifiers 140, power combiner 160, phase shifter module 200, and controller 300. It should be noted that one of ordinary skill in the art will understand how other transmit or receive configurations can be implemented in phased array antenna 100, and that certain components of phased array antenna 100 may be implemented in either digital form (e.g., as software running on a DSP or other processing device, with the addition of a DAC) or as analog components. Additionally, although the components of phased array antenna 100 are shown in a particular order in this example, one of ordinary skill in the art reading this description will understand that the order of components can be varied and some components may be excluded. For simplicity, a discussion of the receive operation of phased array antenna 100, and receive components such as LNAs 140, power combiner 160, and RF receiver 170 will be omitted. However, one having skill in the art will appreciate how such components may implement the reverse operation of the transmit components described herein.

During transmit operation, illustrated by FIG. 1, phased array antenna 100 may steer an antenna beam 400 in a direction by varying the phases of radiating antenna elements 150 so as to produce an effective radiation pattern (as determined by constructive and destructive interference of the signals emitted by each antenna element 150) in a desired direction (azimuthal and/or elevation). For example, the phase of every radiating antenna element 150 may be varied such that there is progressive phase along the rows and/or columns of the radiating elements. As further described below, this may be implemented by using a phase shifter (for every radiating element or group of elements) that can vary the phase of the RF energy radiated by the respective element. As illustrated in this example, a beam 400 is steered at an angle θ relative to elements 150 and includes a main lobe 410 and side lobes 420A-420B.

With specific reference to the elements of phased array antenna 100 during a transmit operation, phased array antenna 100 receives an RF signal from an RF source 110. For example, RF source 110 may take a bit source as an input and perform functions such as signal encoding, interleaving, modulation, and filtering. Signals coming from RF source 110 may be based, for example, on the DVB-S2 standard (ETSI EN 302 307) using signal constellations up to and including at least 32-APSK, or on the Internet Protocol over Satellite (IPoS) standard (ETSI TS 102 354), or on other standard or proprietary specifications incorporating adaptive coding and modulation. Other suitable signal types may also be used, including, for example higher data rate variations of DVB-S2, or DVB-S2 extensions or adaptations sometimes designated as DVB-S2X.

Additionally, RF source 110 may modulate an information signal onto a suitable carrier (e.g., an RF carrier signal)

at a desired frequency. For example, phased array antenna 100 may operate in the Ka-band, Ku-band, C-band or other suitable band. However, it should be noted that the upconversion or modulation of the signal onto a suitable carrier may be performed before or after the phase delay.

Power divider 120 may couple a defined amount of power of a signal provided by RF source 110 to a plurality of signal paths, each of the divided signals being fed along a path to an antenna element 150. For instance, in implementations where each antenna element 150 includes a respective phase shifter, power divider 120 may feed a respective instance of a signal to the phase shifter, which is phase shifted at a quantized phase shifter of module 200, amplified by amplifier 130 and transmitted by an antenna element 150.

Figure 4:
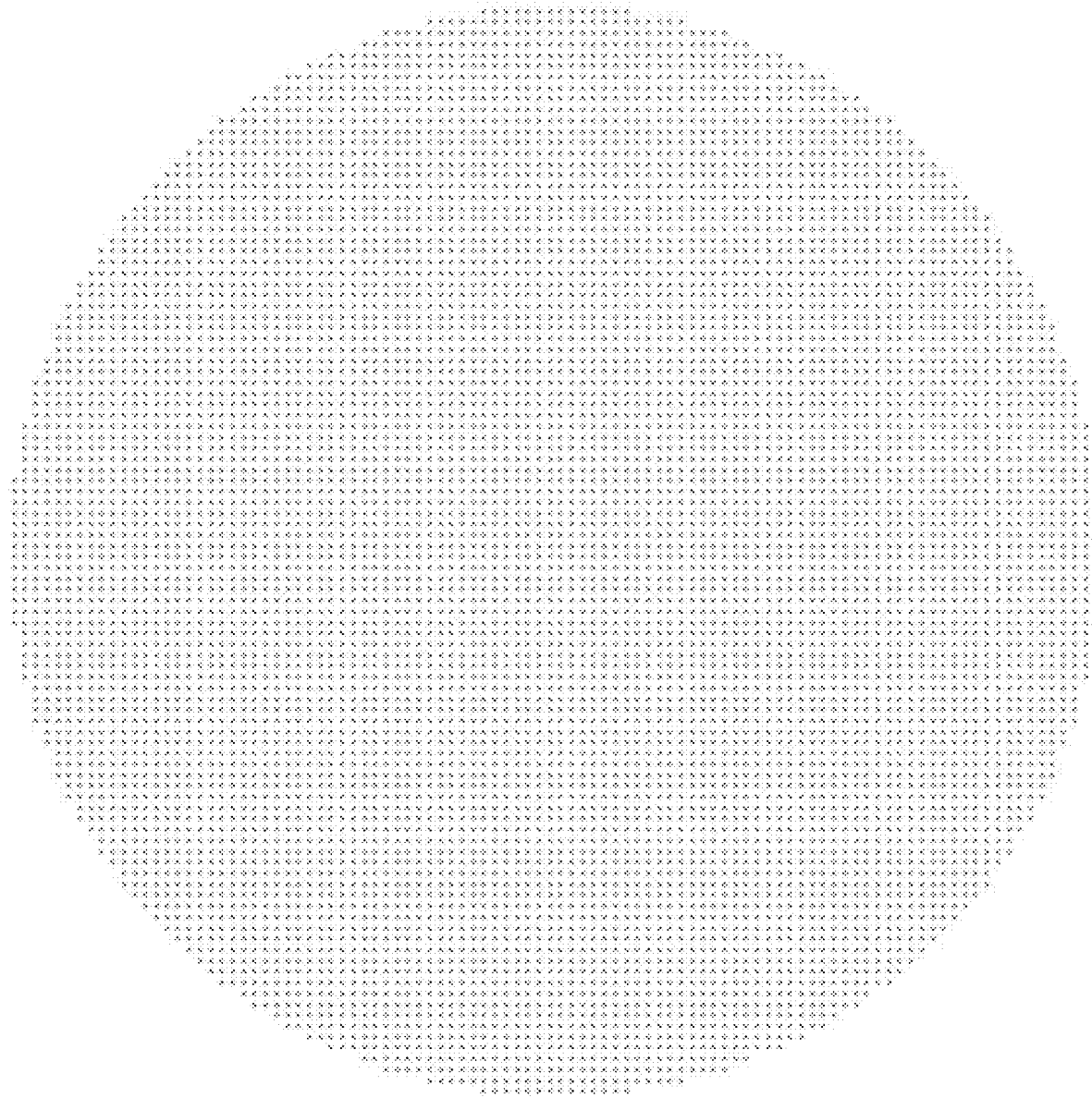
FIG. 4 illustrates one particular implementation of a phased array antenna whereby elements are arranged in a circular array and are spaced apart in half wavelengths.

Depending on the implementation, antenna elements 150 may be arranged in a variety of configurations. For example, antenna elements 150 may be linearly arranged in a linear array, in a rectangular array, a circular array, or some other suitable arrangement. Within the arrangement, antenna elements 150 may be spaced apart depending on the wavelength of the transmitted waveform. For example, elements 150 may be spaced apart in half wavelengths or quarter wavelengths. The number of antenna elements 150 may depend on the gain requirements of phased array antenna 100 and the type of radiator used for each antenna element. For example, a 20 dB gain antenna may require about 100 elements or more, a 30 dB gain antenna may require about 1000 elements or more, and a 40 dB antenna may require about 10,000 elements or more, and so forth. FIG. 4 illustrates one particular implementation of a phased array antenna whereby elements 150 are arranged in a circular array and are spaced apart in half wavelengths.

Figure 5:
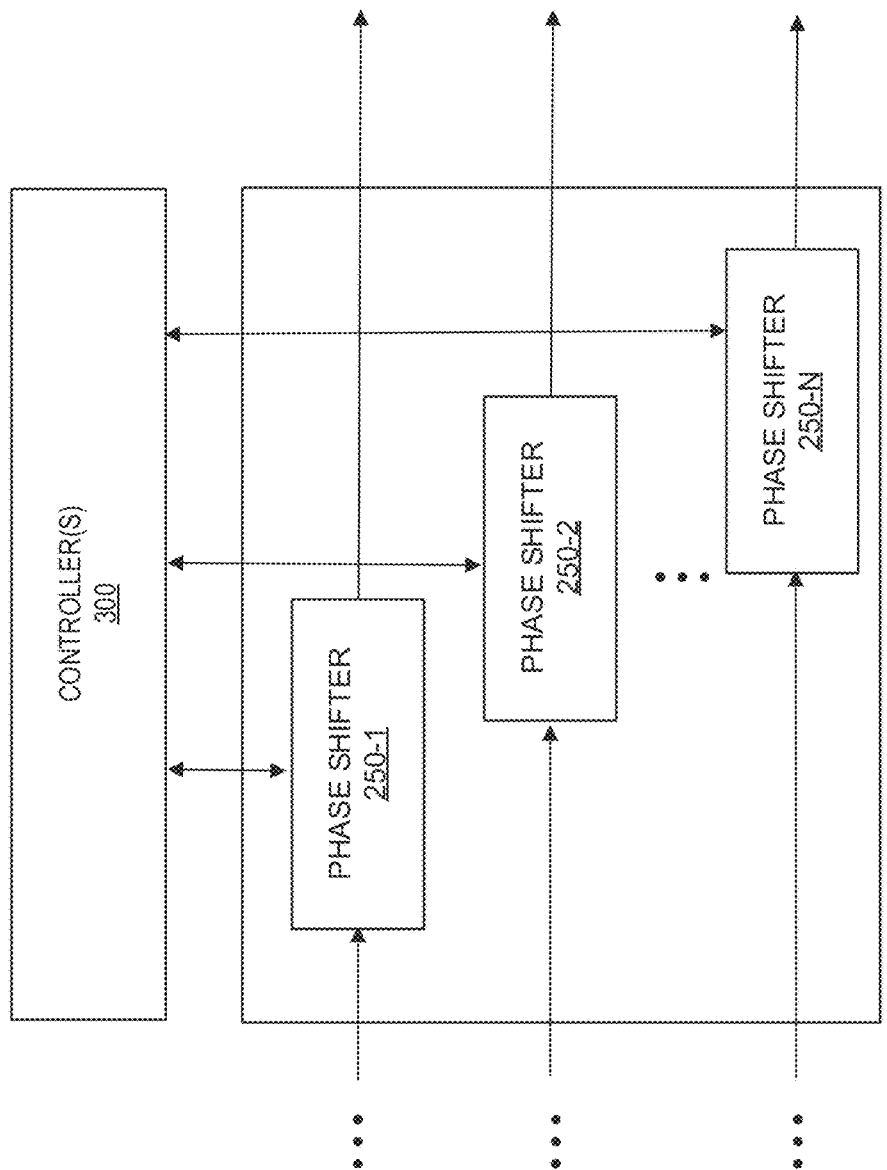
FIG. 5 is a block diagram illustrating an example implementation of the controller and phase shifter module of the phased array antenna of FIG. 3.

Quantized shifter module 200, may include a quantized phase shifter for each element 150 or group of elements 150 that changes the transmission phase angle or true time delay of a signal transmitted by a respective element 150. Each quantized phase shifter may be digitally controlled using one or more bits (e.g., 1 bit, 2 bits, 3 bits, etc.), which provide a discrete set of states that are controlled using a controller 300. This is illustrated by FIG. 5, which is a block diagram illustrating controller 300 controlling quantized phase shifters 250-1 to 250-N of a phased array antenna 100. For example, as discussed above, a two bit phase shifter may have four states: 0°, 90°, 180°, and 270°, and a three bit phase shifter may include eight states: 0°, 45°, 90°, 135°, 180°, 225°, 270°, and 315°. In some implementations, the quantized phase shifters may provide a true time delay as opposed to a constant phase shift over a frequency. For ease of discussion, as used herein, the term "quantized phase shifter" refers to either a phase shifter that provides a constant phase shift over a frequency or a true time delay. Similarly, the term "n-bit phase shifter" may refer to either variety of phase shifter that can be controlled using n digital bits. In implementations, each quantized phase shifter may be bidirectional or unidirectional.

In implementations, controller 300 may be embedded in a chip that has a plurality of switches for controlling the states of quantized phase shifters 250-1 to 250-N. For example, controller 300 may be implemented as a complimentary metal-oxide-semiconductor (CMOS) controller on a chip comprising silicon-germanium switches. In some implementations, multiple controllers 300 may be used to control the states of different sets of quantized phase shifters. In some implementations, circuitry for controller(s) 300 and quantized phase shifters 250-1 to 250-N may be integrated on the same chip or chip(s). For example, each chip may provide circuitry for multiple quantized phase shifters and their associated controller circuitry.

In some implementations, a controller 300 may cause a quantized phase shifter to rapidly switch between each of its states (e.g., using pulse width modulation), thereby effectively dithering the output of the phase shifter and reducing quantization error. For example, consider the case of a 2-bit phase shifter (including states 0° and 90°) and desired phase angle of 22.5 for an antenna element 150. By rapidly switching between the 0° and 90° states with a 75% duty cycle in the 0° state and a 25% duty cycle in the 90° state (e.g., three 0° states for every one 90° state), the time-averaged value of the state of the quantized phase shifter is 22.5°, thereby effectively reducing the quantization error to 0° and providing the same resolution as a 4-bit phase shifter. Particular examples of a quantized phase shifter that is dithered are described in greater detail in U.S. application Ser. No. 15/396,070, titled "DIGITAL DITHERING FOR REDUCTION OF QUANTIZATION ERRORS AND SIDE-LOBE LEVELS IN PHASED ARRAY ANTENNAS," and filed Dec. 30, 2016, which is incorporated herein by reference.

Figure 6:
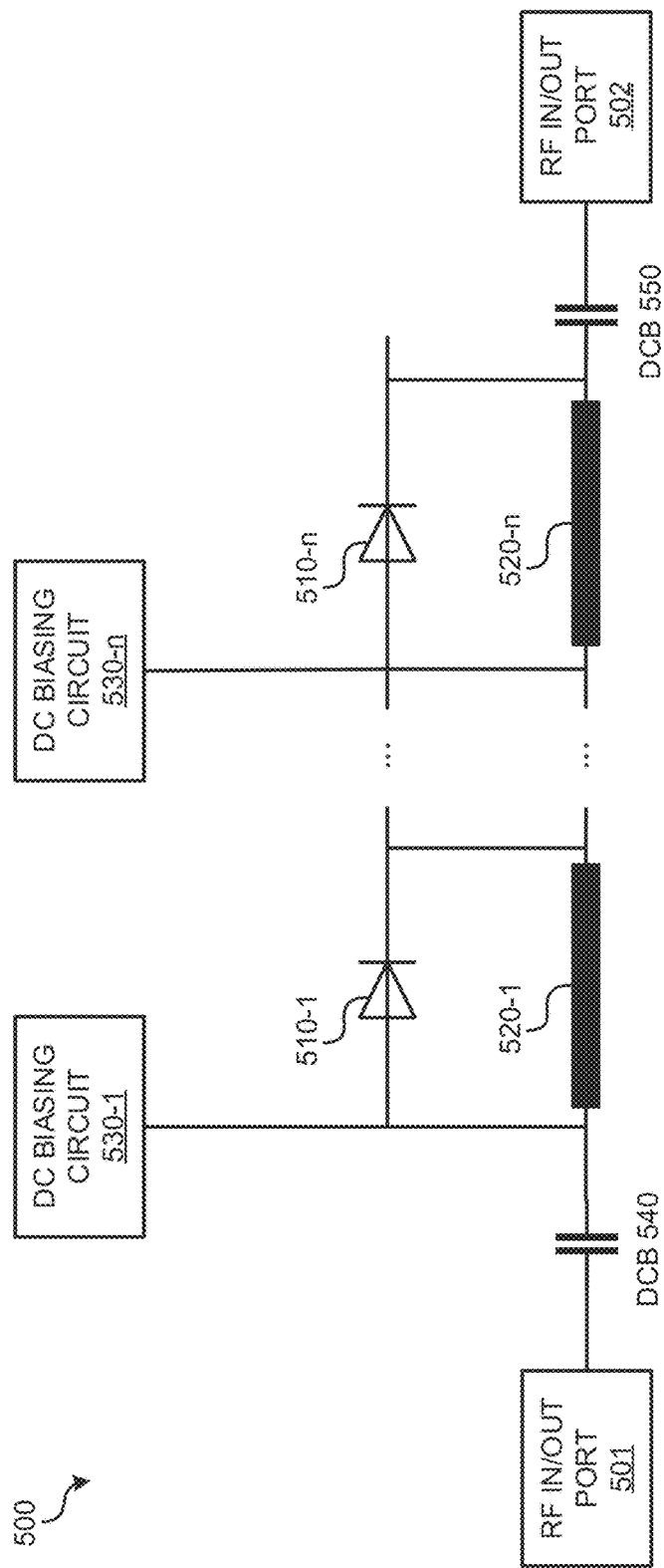
FIG. 6 is a simplified circuit diagram illustrating exemplary circuitry of an n-bit quantized phase shifter in accordance with embodiments.

FIG. 6 is a simplified circuit diagram illustrating exemplary circuitry 500 of a bi-directional n-bit quantized phase shifter in accordance with embodiments. An RF signal received through an RF input port 501 or 502 may be phase shifted by running the RF signal through one or more transmission lines 520-1 to 520-n before the RF signal is output at RF output port 501 or 502. In particular, in this implementation, circuitry of each bit of the phase shifter includes a single PIN diode 510-n in parallel with a transmission line 520-n. The circuitry of each of the bits is in series with the circuitry of the other bits. During operation, each pin diode 510-n may be forward biased or reversed biased by a DC biasing circuit 530-n associated with the bit. The PIN diodes in this illustrative configuration provide a simple mechanism for switching between the two states of their associated phase bit. When a PIN diode 530-1 is forward biased ("on" state) by a DC biasing circuit 530-n, current may flow through the PIN diode. When the pin diode 530-n is not forward biased, e.g., reverse biased or not biased, ("off" state), current flows through the transmission line 520-n parallel to the PIN diode. In this manner, by turning each PIN diode on or off, a phase shift of each transmission line may be applied (PIN diode off) or not applied (PIN diode on). In implementations, each transmission line 520-n may be comprised of a microstrip including a conductive strip and wider ground plate separated by a dielectric layer. Alternatively, in other implementations, each transmission line 520-n may comprise a stripline or other suitable structure for conducting and phase shifting an input RF signal.

Also illustrated in the example circuitry 500 of the n-bit phase shifter are direct current blocking (DCB) capacitors 540 and 550 that are positioned relative to RF ports 501-502 such that any DC bias that is applied to PIN diodes 510-n is prevented from invading the circuitry in the RF signal path.

Figure 7:
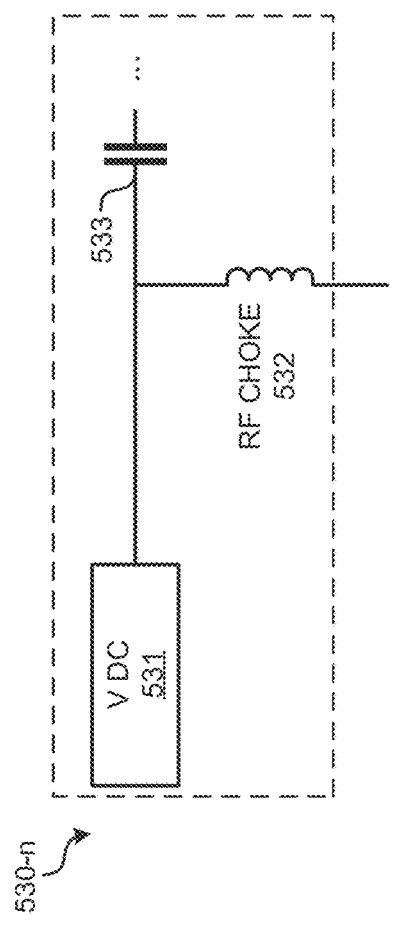
FIG. 7 illustrates an example implementation of a DC biasing circuit in accordance with embodiments.

FIG. 7 illustrates an example implementation of a DC biasing circuit 530-N. As shown, the exemplary circuit includes a direct current voltage source 531 that may apply a constant voltage for generating a DC forward or reverse bias on a respective PIN diode. Additionally, the circuit includes RF choke inductor 532 that blocks any RF signals from escaping the RF signal path while allowing relatively lower frequency DC signals to pass through. In implementations, RF choke inductor 532 may be implemented as a high impedance quarter wavelength transmission line. Such a design may be particularly suitable for higher frequency signals. Additionally, the example DC biasing circuit may include a bypass capacitor 533 that shorts any AC grounds to remove or otherwise reduce any AC noise present on the DC signal. In implementations, bypass capacitor 533 may be implemented as a low impedance quarter-wavelength open stub. Such a design may be particularly suitable for higher frequency signals.

It should be noted that although FIGS. 6-7 illustrates exemplary implementations of an n-bit phase shifter and DC biasing circuitry in accordance with embodiments, circuit elements may be omitted for ease of illustration. Additionally, other configurations of phase shifter circuitry besides those illustrated in FIGS. 6-7 may be implemented where, for each bit of the phase shifter, there is a PIN diode in parallel with a transmission line, and where sufficient isolation is provided between the RF signal circuitry and DC biasing circuitry.

Figure 8:
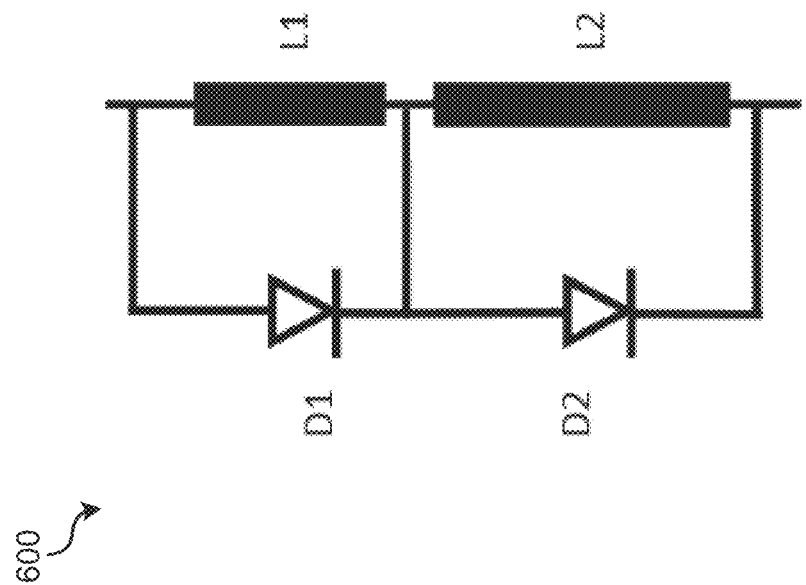
FIG. 8 illustrates example circuitry of a 2-bit phase shifter in accordance with embodiments.

FIG. 8 illustrates example circuitry of a 2-bit phase shifter in accordance with implementations. As illustrated, the 2-bit phase shifter includes first bit circuitry including a transmission line (L1) in parallel with a PIN diode (D1), and second bit circuitry including a transmission line (L2) in parallel with a PIN diode (D2). In contrast to the conventional switched line design, described above, which would require eight pin diodes and four transmission lines to realize 2 phase bits (i.e., four possible phase states), the illustrated design provides 2 phase bits using only two pin diodes and two transmission lines.

Additionally, the power consumption benefits of the design of FIG. 8 over the conventional switched line design described above may be described with reference to Table 1 below, where a PIN diode state of 1 represents a PIN diode that is on (RF signal passes through PIN diode instead of transmission line (on PIN diode creates a "short circuit")), and where a PIN diode state of 0 represents a PIN diode that is off (RF signal passes through transmission line, which adds a phase delay).

TABLE 1

Current requirement and phase shift
for each state of 2-bit phase shifter

| D1 | D2 | Phase shift (deg) | Current Required (assuming 10 mA to turn on diode) |
|---|---|---|---|
| 1 | 1 | 0 | 10 mA |
| 1 | 0 | Φ1 | 10 mA |
| 0 | 1 | Φ2 | 10 mA |
| 0 | 0 | Φ1 + Φ2 | 0 mA |

As illustrated, assuming that 10 mA are used to forward bias each PIN diode, only 10 mA total of current is required to control PIN diodes D1 and D2, regardless of their on/off state. In the case where D1 and D2 are both on, as these PIN diodes are adjacent and in series, the same 10 mA current may be used to turn them on (i.e., the bias voltage does not need to be on for both PIN diodes), providing an additional power consumption savings. This is in contrast to the conventional switched line 2-bit design, where for each phase state of the phase shifter, 4 PIN diodes would need to operate in the on state, thus requiring 40 mA of current.

Figure 9:
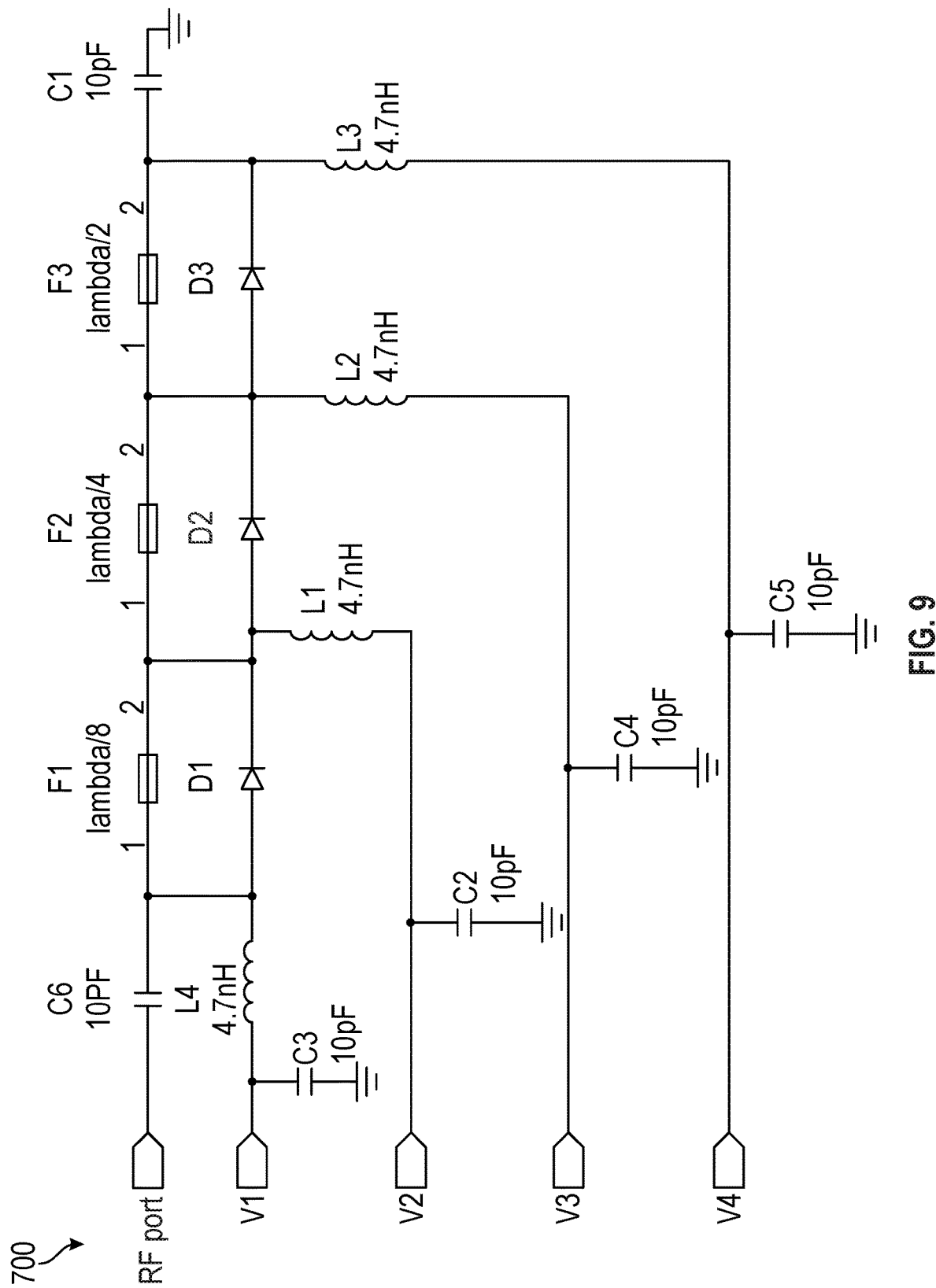
FIG. 9 illustrates an example model of circuitry of a particular implementation of a 3-bit phase shifter in accordance with embodiments.

FIG. 9 illustrates an example model of circuitry 700 of a particular implementation of a 3-bit phase shifter in accordance with embodiments. As illustrated in this example 3-bit implementation, each bit of circuitry respectively includes a PIN diode (D1, D2, or D3) in parallel with a transmission line (F1, F2, or F3). Additionally, each bit of circuitry is connected to a respective DC biasing circuit including a constant voltage source, a DC blocking capacitor, and an RF choke inductor. In this example, the transmission lines have electrical lengths of $\lambda/8$, $\lambda/4$, and $\lambda/2$, which assuming idealized conditions, respectively provide phase shifts of 45°, 90°, and 180°. For example, if a phase shift of 270° is desired (D1=on, D2=off, D3=off), then source V1 may provide a voltage and V2 may be grounded. As another example, if a phase shift of 315° is desired (all diodes on), then a constant voltage drop may be provided from V1 to V2 to V3 while utilizing V4 as a ground.

In this design, adjacent diodes that are on may share a current. For example, if D1 and D2 are both on, they may share a biasing current. As another example, if D1, D2, and D3 are all on, they may all share a biasing current. Table 2 below, illustrates the current requirements and phase shift for each state of the 3-bit phase shifter illustrated in FIG. 9, assuming that 10 mA are used to turn on each PIN diode, where a PIN diode state of 1 represents a PIN diode that is on, and where a PIN diode state of 0 represents a PIN diode that is off.

TABLE 2

Current requirement and phase shift
for each state of 3-bit phase shifter

| D1 | D2 | D3 | Phase shift (deg) | Current Required (assuming 10 mA to turn on diode) |
|---|---|---|---|---|
| 1 | 1 | 1 | 0 | 10 mA |
| 0 | 1 | 1 | 45 | 10 mA |
| 1 | 0 | 1 | 90 | 20 mA |
| 1 | 1 | 0 | 180 | 10 mA |
| 0 | 0 | 1 | 135 | 10 mA |
| 0 | 1 | 0 | 225 | 10 mA |
| 1 | 0 | 0 | 270 | 10 mA |
| 0 | 0 | 0 | 315 | 0 mA |

Figure 2:
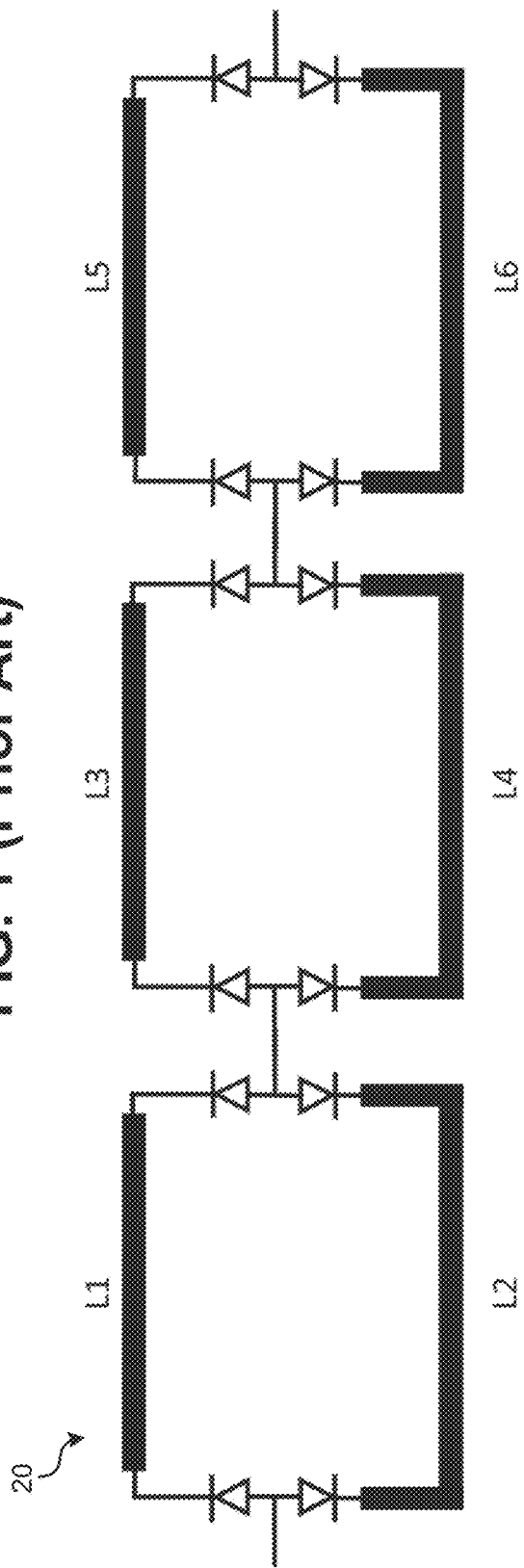
FIG. 2 illustrates a basic schematic of a conventional design of a 3-bit switched line phase shifter.

As illustrated by Table 2, assuming that all diodes are forward biased at 10 mA, then the maximum current required at any time in this implementation is 20 mA. The maximum current of 20 mA is only required in one of the nine states: when the two forward biased diodes (D1 and D3) are not adjacent. In seven other states, only 10 mA of current is required. In the state where all diodes are off, no biasing current is required. By contrast, in the conventional switched line 3-bit design, illustrated by FIG. 2 above, 60 mA of biasing current (2 PIN diodes on per bit) is constantly required to maintain a complete RF signal path.

Figure 10:
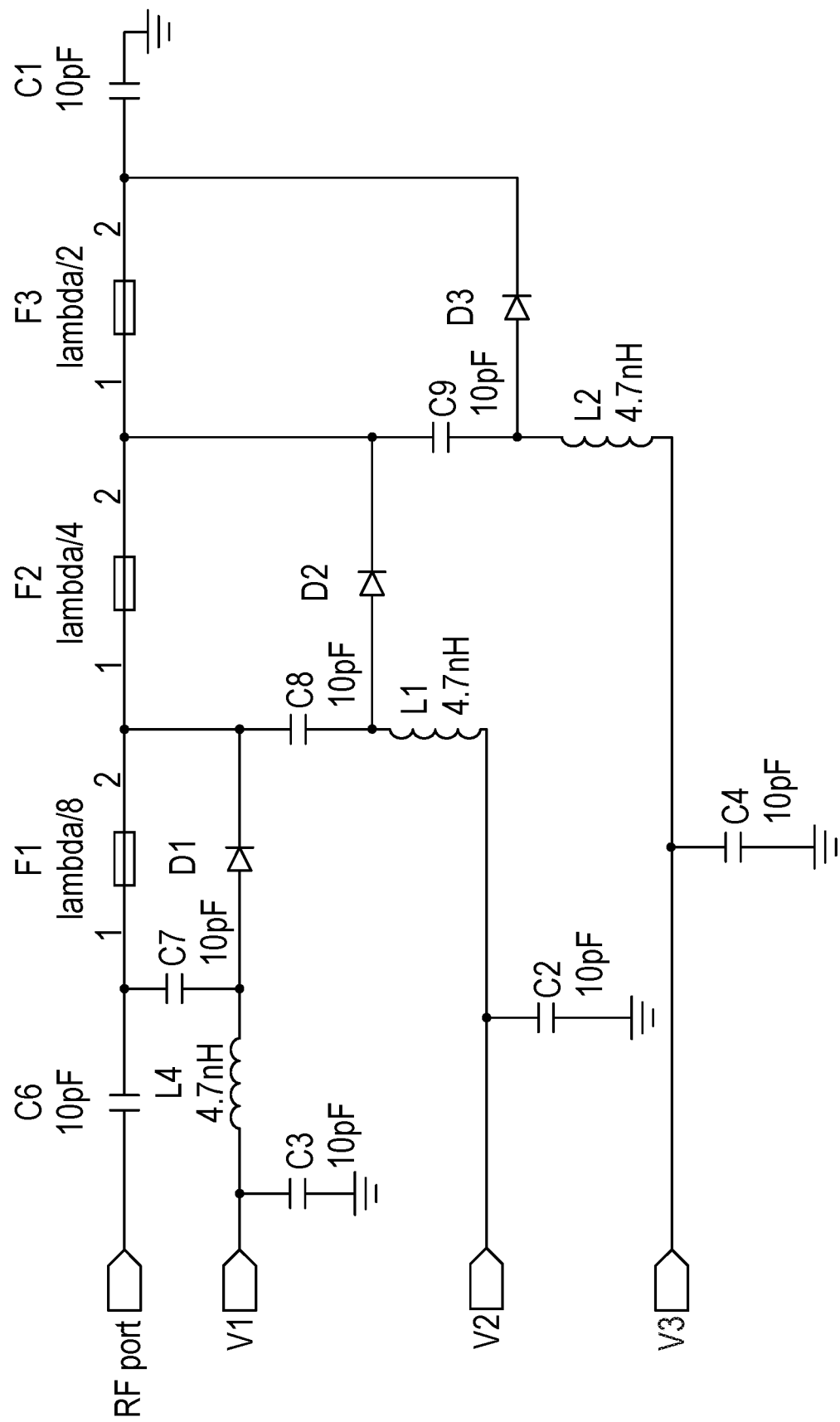
FIG. 10 illustrates another example model of circuitry that may be used in a particular implementation of a 3-bit phase shifter in accordance with some embodiments.

FIG. 10 illustrates another example model of circuitry that may be used in a particular implementation of a 3-bit phase shifter in accordance with some embodiments. Similar to the example of FIG. 9, in the example 3-bit implementation of FIG. 10, each bit of circuitry respectively includes a PIN diode (D1, D2, or D3) in parallel with a transmission line (F1, F2, or F3). Unlike the example of FIG. 9, DC blocking capacitors (e.g., C8 and C9) prevent the PIN diode of each bit of the phase shifter from sharing a biasing current with the PIN diodes of adjacent bits. Although a higher average biasing current is required during operation of the design of FIG. 10 as contrasted with the design of FIG. 9, this design may provide the advantage of reducing the total number of required voltage lines (e.g., three in FIG. 10 as opposed to four in FIG. 9). In some implementations, the phase shifter circuit may be configured such that some PIN diodes are capable of sharing a biasing current with adjacent PIN diodes and other PIN diodes cannot share a biasing current with adjacent PIN diodes (e.g., by selective insertion of DC blocking capacitors).

Figure 11:
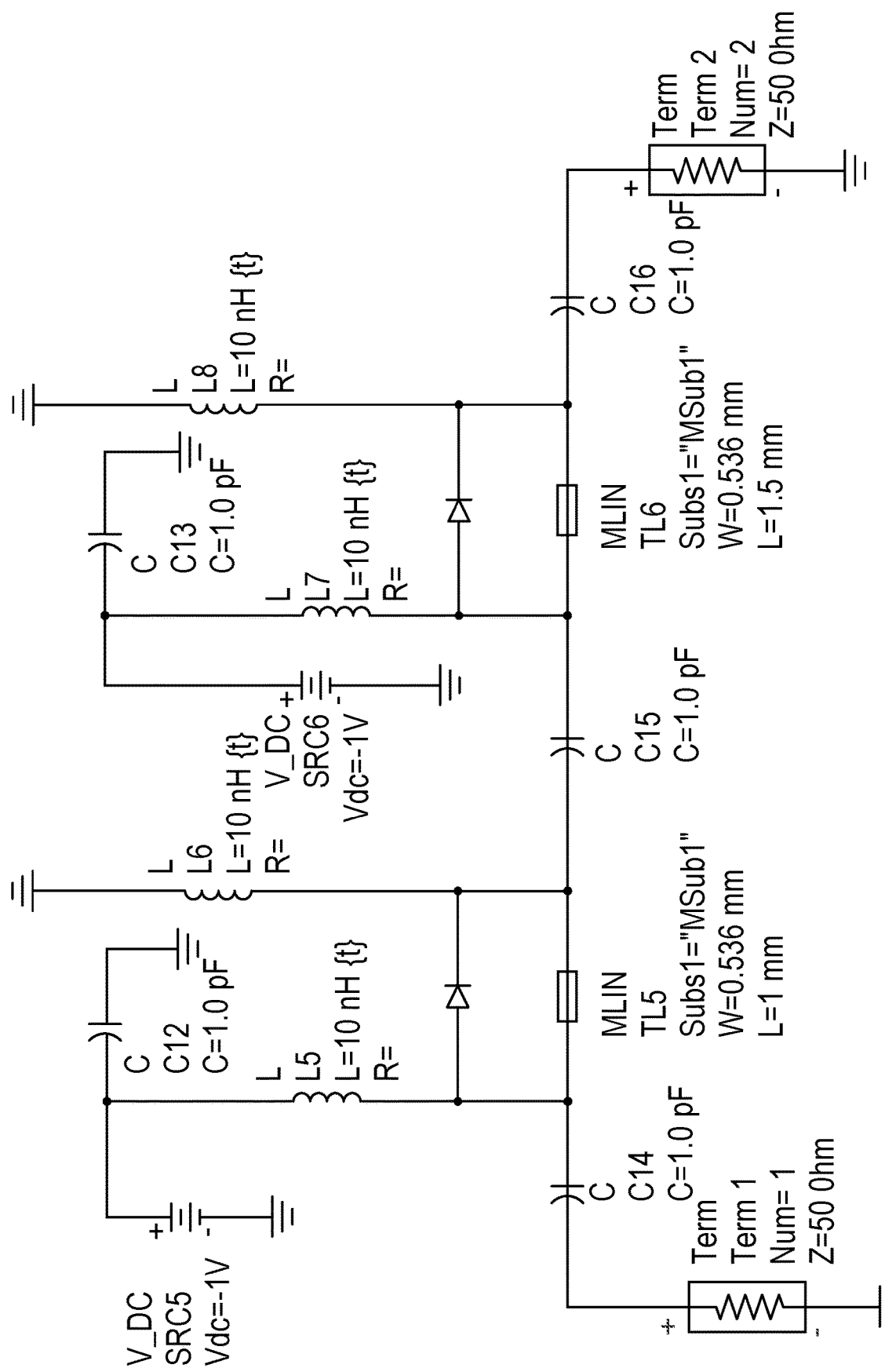
FIG. 11 illustrates another example model of circuitry for a particular implementation of a 2-bit phase shifter that was created using the Advanced Design System (ADS) circuit simulator.

FIG. 11 illustrates another example model of circuitry for a particular implementation of a 2-bit phase shifter that was created using the Advanced Design System (ADS) circuit simulator.

Figure 12:
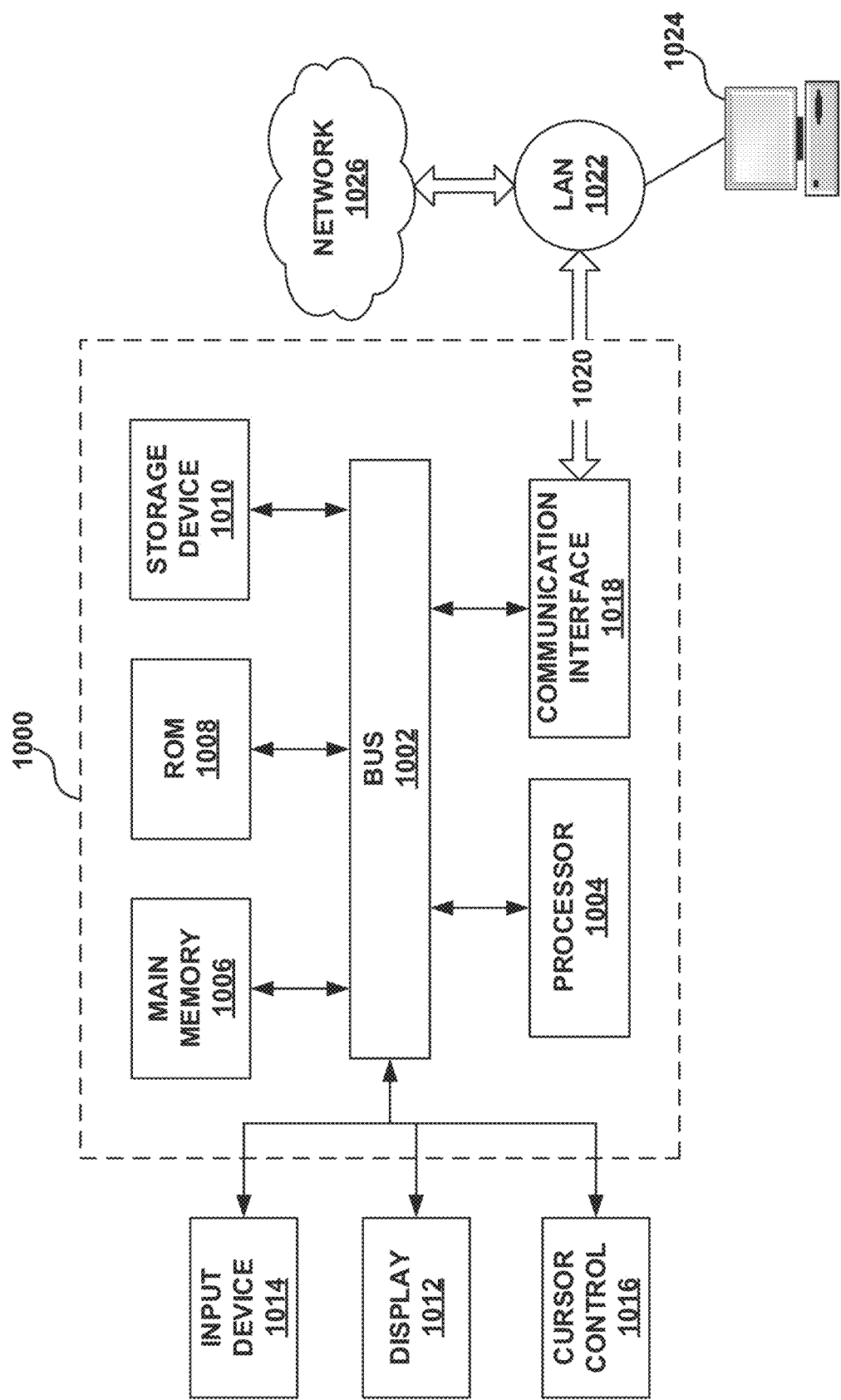
FIG. 12 illustrates an example computing module that may be used in implementing features of various embodiments.

FIG. 12 illustrates a computer system 1000 upon which example embodiments according to the present disclosure can be implemented. Computer system 1000 can include a bus 1002 or other communication mechanism for communicating information, and a processor 1004 coupled to bus 1002 for processing information. Computer system 1000 may also include main memory 1006, such as a random access memory (RAM) or other dynamic storage device, coupled to bus 1002 for storing information and instructions to be executed by processor 1004. Main memory 1006 can also be used for storing temporary variables or other intermediate information during execution of instructions to be executed by processor 1004. Computer system 1000 may further include a read only memory (ROM) 1008 or other static storage device coupled to bus 1002 for storing static information and instructions for processor 1004. A storage device 1010, such as a magnetic disk or optical disk, may additionally be coupled to bus 1002 for storing information and instructions.

Computer system 1000 can be coupled via bus 1002 to a display 1012, such as a cathode ray tube (CRT), liquid crystal display (LCD), active matrix display, light emitting diode (LED)/organic LED (OLED) display, digital light processing (DLP) display, or plasma display, for displaying information to a computer user. An input device 1014, such as a keyboard including alphanumeric and other keys, may be coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012.

According to some embodiments, control of one or more phase shifters, may be provided by computer system 1000 in response to processor 1004 executing an arrangement of instructions contained in main memory 1006. Such instructions can be read into main memory 1006 from another computer-readable medium, such as storage device 1010. Execution of the arrangement of instructions contained in main memory 1006 causes processor 1004 to perform one or more processes described herein. One or more processors in a multi-processing arrangement may also be employed to execute the instructions contained in main memory 1006. In alternative embodiments, hard-wired circuitry is used in place of or in combination with software instructions to implement various embodiments.

Computer system 1000 may also include a communication interface 1018 coupled to bus 1002. Communication interface 1018 can provide a two-way data communication coupling to a network link 1020 connected to a local network 1022. By way of example, communication interface 1018 may be a digital subscriber line (DSL) card or modem, an integrated services digital network (ISDN) card, a cable modem, or a telephone modem to provide a data communication connection to a corresponding type of telephone line. As another example, communication interface 1018 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1018 sends and receives electrical, electromagnetic, or optical signals that carry digital data streams representing various types of information. Further, communication interface 1018 may include peripheral interface devices, such as a Universal Serial Bus (USB) interface, a PCMCIA (Personal Computer Memory Card International Association) interface, etc.

Network link 1020 typically provides data communication through one or more networks to other data devices. By way of example, network link 1020 can provide a connection through local network 1022 to a host computer 1024, which has connectivity to a network 1026 (e.g. a wide area network (WAN) or the global packet data communication network now commonly referred to as the "Internet") or to data equipment operated by service provider. Local network 1022 and network 1026 may both use electrical, electromagnetic, or optical signals to convey information and instructions. The signals through the various networks and the signals on network link 1020 and through communication interface 1018, which communicate digital data with computer system 1000, are example forms of carrier waves bearing the information and instructions.

Computer system 1000 may send messages and receive data, including program code, through the network(s), network link 1020, and communication interface 1018. In the Internet example, a server (not shown) might transmit requested code belonging to an application program for implementing an embodiment of the present disclosure through network 1026, local network 1022 and communication interface 1018. Processor 1004 executes the transmitted code while being received and/or store the code in storage device 1010, or other non-volatile storage for later execution. In this manner, computer system 1000 obtains application code in the form of a carrier wave.

The term "computer-readable medium" as used herein refers to any medium that participates in providing instructions to processor 1004 for execution. Such a medium may take many forms, including but not limited to non-volatile media, volatile media, and transmission media. Non-volatile media include, for example, optical or magnetic disks, such as storage device 1010. Volatile media may include dynamic memory, such as main memory 1006. Transmission media may include coaxial cables, copper wire and fiber optics, including the wires that comprise bus 1002. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. By way of example, the instructions for carrying out at least part of the present disclosure may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Figure 13:
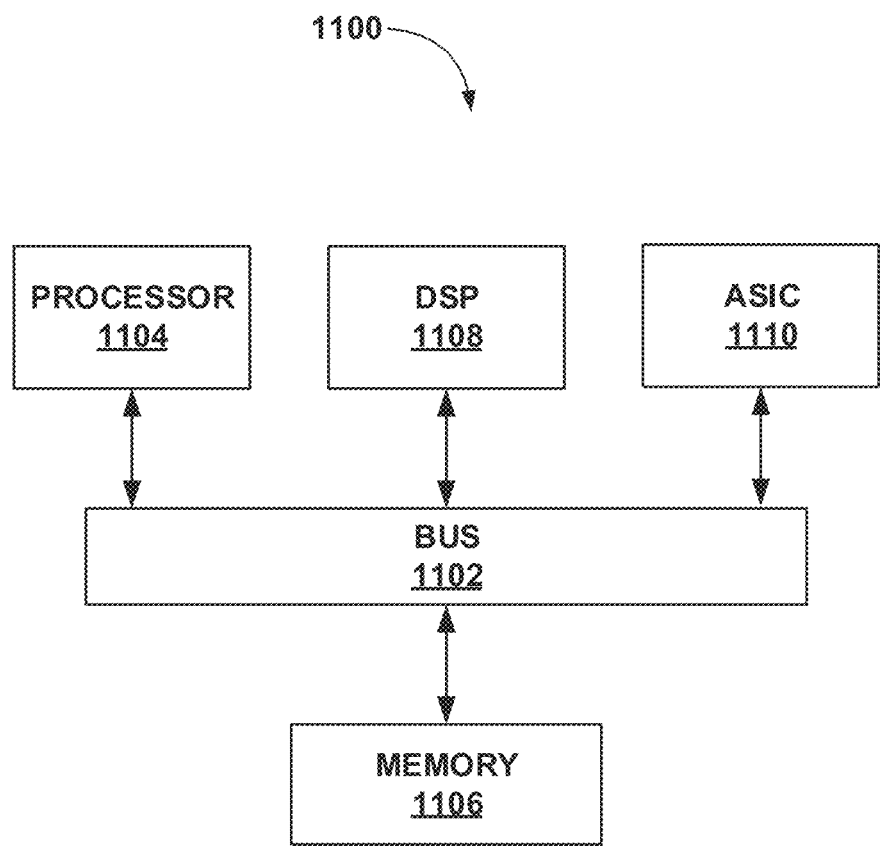
FIG. 13 illustrates an example chip set that can be utilized in implementing architectures and methods in accordance with various embodiments.

FIG. 13 illustrates a chip set 1100 in which embodiments of the disclosure may be implemented. Chip set 1100 can include, for instance, processor and memory components described with respect to FIG. 8 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, chip set 1100 includes a communication mechanism such as a bus 1002 for passing information among the components of the chip set 1100. A processor 1104 has connectivity to bus 1102 to execute instructions and process information stored in a memory 1106. Processor 1104 includes one or more processing cores with each core configured to perform independently. A multi-core processor enables multiprocessing within a single physical package. Examples of a multi-core processor include two, four, eight, or greater numbers of processing cores. Alternatively or in addition, processor 1104 includes one or more microprocessors configured in tandem via bus 1102 to enable independent execution of instructions, pipelining, and multithreading. Processor 1004 may also be accompanied with one or more specialized components to perform certain processing functions and tasks such as one or more digital signal processors (DSP) 1108, and/or one or more application-specific integrated circuits (ASIC) 1110. DSP 1108 can typically be configured to process real-world signals (e.g., sound) in real time independently of processor 1104. Similarly, ASIC 1110 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

Processor 1104 and accompanying components have connectivity to the memory 1106 via bus 1102. Memory 1106 includes both dynamic memory (e.g., RAM) and static memory (e.g., ROM) for storing executable instructions that, when executed by processor 1104, DSP 1108, and/or ASIC 1110, perform the process of example embodiments as described herein. Memory 1106 also stores the data associated with or generated by the execution of the process.

As used herein, the term module might describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the application are implemented in whole or in part using software, in one embodiment, these software elements can be implemented to operate with a computing or processing module capable of carrying out the functionality described with respect thereto. One such example computing module is shown in FIG. 7. Various embodiments are described in terms of this example-computing module 1000. After reading this description, it will become apparent to a person skilled in the relevant art how to implement the application using other computing modules or architectures.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the present application, whether or not such embodiments are described and whether or not such features are presented as being a part of a described embodiment. Thus, the breadth and scope of the present application should not be limited by any of the above-described exemplary embodiments.

Terms and phrases used in the present application, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A phase shifter, comprising:
first circuitry corresponding to a first bit of the phase shifter, the first circuitry comprising:
a first PIN diode;
a first transmission line parallel to the first PIN diode, wherein the first transmission line is configured to phase shift a radio frequency (RF) signal that passes through the first transmission line; and
a first biasing circuit configured to forward bias or reverse bias the first PIN diode, wherein an RF signal received at the phase shifter passes through the first PIN diode when the first PIN diode is under forward bias, and wherein the RF signal received at the phase shifter passes through the first transmission line when the first PIN diode is not under forward bias.

2. The phase shifter of claim 1, further comprising:
second circuitry in series with the first circuitry, wherein the second circuitry corresponds to a second bit of the phase shifter, wherein the second circuitry comprises:
a second PIN diode;
a second transmission line parallel to the second PIN diode, wherein the second transmission line is configured to phase shift an RF signal that passes through the second transmission line; and
a second biasing circuit configured to forward bias or reverse bias the second PIN diode, wherein the RF signal received at the phase shifter passes through the second PIN diode when the second PIN diode is forward biased, and wherein the RF signal received at the phase shifter passes through the second transmission line when the second PIN diode is not forward biased.

3. The phase shifter of claim 2, wherein the first biasing circuit is configured to forward bias the second PIN diode when both the first PIN diode and the second PIN diode are forward biased, and wherein the second biasing circuit is configured to forward bias the second PIN diode when the first PIN diode is not forward biased.

4. The phase shifter of claim 2, wherein the phase shifter is an n-bit phase shifter where n≥2, and wherein a number of transmission lines in the phase shifter is equal to n.

5. The phase shifter of claim 4, wherein a number of PIN diodes in the phase shifter is equal to n.

6. The phase shifter of claim 4, wherein n≥4.

7. The phase shifter of claim 1, wherein the first biasing circuit comprises: a direct current voltage source configured to apply a constant voltage for generating a forward or reverse bias on the first PIN diode.

8. The phase shifter of claim 7, wherein the first biasing circuit further comprises: an inductor configured to block RF signals from entering the first biasing circuit.

9. The phase shifter of claim 8, wherein the first biasing circuit, further comprises: a bypass capacitor configured to reduce AC noise present on a DC signal generated at the first biasing circuit.

10. The phase shifter of claim 1, further comprising:
an input RF port and an output RF port;
a first direct current blocking capacitor configured to block DC bias from flowing into the input RF port; and
a second direct current blocking capacitor configured to block DC bias from flowing into the output RF port.

11. An antenna, comprising:
a plurality of quantized phase shifters, each of the plurality of quantized phase shifters comprising a first circuit block corresponding to a first bit of the quantized phase shifter, the first circuit block comprising:
a transmission line configured to phase shift a radio frequency (RF) signal that passes through the transmission line;
a PIN diode in parallel with the transmission line; and
a biasing circuit configured to forward bias or reverse bias the PIN diode, wherein an RF signal received at the quantized phase shifter passes through the PIN diode when the PIN diode is under forward bias, and wherein the RF signal received at the phase shifter passes through the transmission line when the PIN diode is not under forward bias; and
a plurality of antenna elements, wherein each of the plurality of antenna elements is configured to receive a phase shifted signal from a respective one of the plurality of quantized phase shifters.

12. The antenna of claim 11, wherein each of the plurality of quantized phase shifters is an n-bit phase shifter where n≥2, and wherein each of the plurality of quantized phase shifters comprises n circuit blocks, wherein each of the n circuit blocks comprises a PIN diode in parallel with a transmission line configured to phase shift an RF signal that passes through the transmission line.

13. The antenna of claim 12, wherein for each of the plurality of quantized phase shifters, the n circuit blocks are in series.

14. The antenna of claim 13, wherein each of the plurality of quantized phase shifters comprises n transmission lines and n PIN diodes.

15. The antenna of claim 11, wherein each of the biasing circuits comprises:
a direct current voltage source configured to apply a constant voltage for generating a forward bias or reverse bias on the PIN diode; and
an inductor configured to block RF signals from entering the biasing circuit.

16. The antenna of claim 11, wherein the antenna is a phased array or reflect array antenna.

17. A method, comprising:
receiving a first radio frequency (RF) signal at an input RF port of a quantized phase shifter, wherein the quantized phase shifter comprises first circuitry corresponding to a first bit of the quantized phase shifter, the first circuitry comprising: a first PIN diode in parallel to a first transmission line configured to phase shift an input RF signal that passes through the first transmission line;
forwarding biasing the first PIN diode; and
after forward biasing the first PIN diode, passing the first RF signal through the first PIN diode and not the first transmission line.

18. The method of claim 17, further comprising:
receiving a second RF signal at the input RF port;
reverse biasing the first PIN diode; and
after reverse biasing the first PIN diode, passing the second RF signal through the first transmission line and not the first PIN diode.

19. The method of claim 17, wherein the quantized phase shifter comprises second circuitry in series with the first circuitry, the second circuitry corresponding to a second bit of the quantized phase shifter, wherein the second circuitry comprises a second PIN diode in parallel to a second transmission line configured to phase shift an input RF signal that passes through the second transmission line, wherein the method further comprises:
   forward biasing the second PIN diode; and
   after forward biasing the second PIN diode, passing the first RF signal through the second PIN diode and not the second transmission line.

20. The method of claim 19, wherein the first PIN diode and the second PIN diode are forward biased using the same current.

* * * * *